United States Patent [19]

Ohno et al.

[11] 4,255,672
[45] Mar. 10, 1981

[54] LARGE SCALE SEMICONDUCTOR INTEGRATED CIRCUIT DEVICE

[75] Inventors: Kenichi Ohno, Tokyo; Tohru Hosomizu; Rokutaro Ogawa, both of Yokohama; Mitsuhisa Shimizu, Kawasaki, all of Japan

[73] Assignee: Fujitsu Limited, Kawasaki, Japan

[21] Appl. No.: 973,908

[22] Filed: Dec. 28, 1978

[30] Foreign Application Priority Data

Dec. 30, 1977 [JP] Japan .................. 52-158444

[51] Int. Cl.³ .................. H01L 27/04; H03K 19/086
[52] U.S. Cl. .................. 307/455; 357/40; 357/45; 357/51
[58] Field of Search .................. 357/40, 45, 68, 51, 357/71; 307/213, 303

[56] References Cited

U.S. PATENT DOCUMENTS

| | | | |
|---|---|---|---|
| 3,225,261 | 12/1965 | Wolf | 357/28 |
| 3,539,876 | 11/1970 | Feinberg et al. | 357/48 |
| 3,555,443 | 1/1971 | Tsugita | 357/40 |
| 3,621,562 | 11/1971 | Patel | 357/40 |
| 3,638,202 | 1/1972 | Schroeder | 357/45 |
| 3,689,803 | 9/1972 | Baker et al. | 357/48 |
| 3,747,078 | 7/1973 | Rose | 307/213 |
| 3,808,475 | 4/1974 | Buelow et al. | 357/45 |
| 3,817,797 | 6/1974 | Langdon | 357/40 |
| 3,866,066 | 2/1975 | Pedersen | 307/213 |
| 3,909,636 | 9/1975 | Masaki et al. | 357/40 |

*Primary Examiner*—William D. Larkins
*Attorney, Agent, or Firm*—Staas and Halsey

[57] ABSTRACT

A large scale semiconductor integrated circuit device comprising plural transistors and resistors formed in one semiconductor substrate, and many emitter-coupled circuits formed by connecting the transistors and resistors with a double metallic layer on the substrate surface.

Groups of these emitter coupled circuits are disposed in the form of arrays with circuits of several groups handling larger power than those of other groups, and resistance values in the emitter coupled circuits of the different groups are selected in accordance with the position and arrangement of each group to compensate for any potential variation between that group and the power supply and ground terminals between the groups and respective input/output terminals. Large scale transistors are provided for outputting the emitter-follower circuits. These groups contain the emitter coupled circuits, and are connected to the input/output terminals by the double metallic wiring layer.

8 Claims, 11 Drawing Figures

LARGE SCALE SEMICONDUCTOR INTEGRATED CIRCUIT DEVICE

BACKGROUND OF THE INVENTION

1. Field of the Invention

The present invention relates to a large scale semiconductor integrated circuit device, particularly to a large scale semiconductor integrated circuit device configuration with a high integration density, high speed of operation and low power consumption.

2. Description of the Prior Art

A continued advancement of electronic circuitry and electronic computer systems demands increased integration density and speed of operation of semiconductor integrated circuit devices.

As a means of realizing high integration density and high speed of operation a method for designing integrated circuits known as the master-slice technique is typically employed. The master-slice technique is described, for example, in the Feb. 20, 1976 issue of "Electronics", pages 136 to 139. Namely, individual unit circuit areas are located along the row and column directions at the surface of a semiconductor substrate, wiring channels (wiring tracks) are laid out between these unit circuit areas, the wiring between these unit circuit areas is generally formed within these wiring channels. According to this master-slice technique, an increase in the number of cirucits provided within the unit circuit areas, and in the number of unit circuit areas formed in the semiconductor substrate, results in a semiconductor integrated circuit having higher integration density.

For example, U.S. Pat. No. 3,643,232 (issued Feb. 15, 1972) discloses that functional elements or cells (corresponding to the unit circuit areas) are defined with proper separation in the form of an array in the row and column directions on the surface of a semiconductor substrate, the wiring of each functional element or each cell being made by a first wiring layer and the wiring between the different cells being made by a second wiring layer. By such means, the operable cells formed with the first wiring layer may be inerconnected by the second wiring layer, and a logic circuit having the desired logic function can thus be formed in the semiconductor substrate. According to such a prior art technique, a large scale integrated circuit having only operable circuits can be formed within a semiconductor substrate.

The basic approach of such a general master-slice technique is well known, but the configuration and means for realizing the currently demanded higher inegration density and high speed of operation is not suggested by the prior art.

For example, the U.S. Pat. No. 3,808,475 (issued Apr. 30, 1974) discloses a large scale semiconductor integrated circuit device comprising 100 emitter coupled logic (ECL) circuits within a single semiconductor substrate which allows a signal transfer delay time of 2 ns or less. The large scale semiconductor integrated circuit device disclosed in this U.S. patent involves basic logic circuits with emitter coupled logic (ECL). This circuit device has 25 macros (corresponding to said unit circuit area, functional element or cell), where a total of four ECLs forms a group, the macros being arrayed with adequate separation gap in row and column directions on a single semiconductor substrate surface. The wiring between the macros, for connecting the power supply ($V_{EE}$) and for connecting the components within each macro, comprises a first wiring layer extending in the row direction while connection of the macros and the wiring for grounding ($V_{CC}$) is provided by the second wiring layer extending in the column direction. Larger transistors are arranged between the macros and the output terminal pads, for outputing the emitter-follower circuits. Moreover, the width of the ground ($V_{CC}$) wiring and the power supply ($V_{EE}$) wiring is adjusted to provide resistance ratios of between 3 to 1 and 4 to 1, to compensate (or track) for voltage change due to a macro's position and the temperature distribution in the semiconductor substrate.

With such a configuration for a large scale semiconductor integrated circuit device, some improvement has been realized in integration density and operating speed, the improvement being in many cases sufficient to provide the performance required of currently known electronic devices. But with this approach it will be difficult to satisfy the prformance to be required for practical use in the future. Particularly, since macros are arrayed on a single semiconductor substrate with some interval in both row and column directions, any improvement in integration density is limited.

In addition, within the large scale semiconductor integrated circuit elements, one may provide macros comprising logic circuits terminating within the semiconductor integrated circuit device itself, and macros for forming logic circuits to be connected to external circuits outside of the semiconductor integrated circuit device. All the macros may be formed by using an impurity diffusion mask with a repeated pattern, as a result of which the size of the transistors and resistors of each macro, and the impurity concentration etc., are the same for all macros. Therefore, even for the macros for internal termination, which could be driven with lower electrical power, a considerable amount of power is consumed, an amount equal to that consumed by the macros for external circuit output, which are driven with large amounts of electrical power. All the macros in such a semiconductor integrated circuit device consume large amounts of electrical power, thus necessitating a large capacity power supply and a large size heat sink.

Moreover, some difference in resistance may be provided along the ground wiring and the power supply wiring in order to compensate for voltage variations due to the position of a macro and the temperature distribution over the semiconductor substrate. However, such a means for compensating voltage loss by variation of resistance in such wirings becomes more difficult with increase in the number of macros included in the semiconductor integrated circuit device, and when integration density is increased, sufficient compensation becomes difficult. Design problems for determining and providing the necessary resistance values then become severe.

SUMMARY OF THE INVENTION

It is an object of this invention to offer a large scale semiconductor integrated circuit device which can generally provide very high performance.

It is another object of this invention to offer a large scale semiconductor integrated circuit device having higher integration density.

It is another object of this invention to offer a large scale semiconductor integrated circuit device which comsumes less electrical power, while having a high integration density.

It is still a further object of this invention to offer a large scale semiconductor integrated circuit device which has a large driving capability for external circuits to be connected to the integrated circuit.

Yet another object of this invention is to offer a large scale semiconductor integrated circuit device wherein variation in supply voltage across each component of the device is compensated (tracked) and thereby operation is well stabilized.

An additional object of this invention is to offer a large scale semiconductor integrated circuit device which comprises various logic circuits or control circuits.

Thus, the present invention offers a large scale semiconductor integrated circuit device comprising:

a semiconductor substrate having a planar surface;

plural transistors formed in accordance with a predetermined pattern on the semiconductor substrate and extending into the substrate;

plural resistors formed in accordance with a pedetermined pattern on the semiconductor substrate and extending into the substrate;

metallic layers arranged on the semiconductor substrate and connected to the transistors and resistors to form various circuits;

macros comprising logic circuits arrayed on the flat surface of the semiconductor substrate;

input/output terminal pads arranged near the periphery of the macro array on the semiconductor substrate;

some of the macros comprising logic circuits which handle a large amount of electrical power and other macros comprising logic circuits which handle little electrical power, the macros which handle a large amount of electrical power being arranged at the edges of the macro array with the macros handling low electrical power being at least partially arranged within the inner portion of the array.

The present invention also offers a large scale semiconductor integrated circuit device, comprising:

a semiconductor substrate having a planar surface;

plural transistors formed in a predetermined pattern on the surface of the semiconductor substrate and extending into the substrate;

plural resistors formed in accordance with a predetermined pattern on the substrate surface and extending into the substrate;

metallic layers arranged on the semiconductor substrate and connected to the transistors and resistors to form various circuits;

input/output terminal pads arranged on the substrate near the periphery of the macro array;

macros comprising plural logic circuits arrayed on the flat surface of the semiconductor substrate; and the values of the resistors being selected so that the resistors forming said logic circuits compensate for voltage variation of power supply and ground as distributed by the metallic layers to said macros.

BRIEF DESCRIPTION OF DRAWINGS

FIGS. 11a–n are cross-sections showing the manufacturing process for a large scale semiconductor integrated circuit device of the present invention.

DESCRIPTION OF PREFERRED EMBODIMENTS

Figure 1:
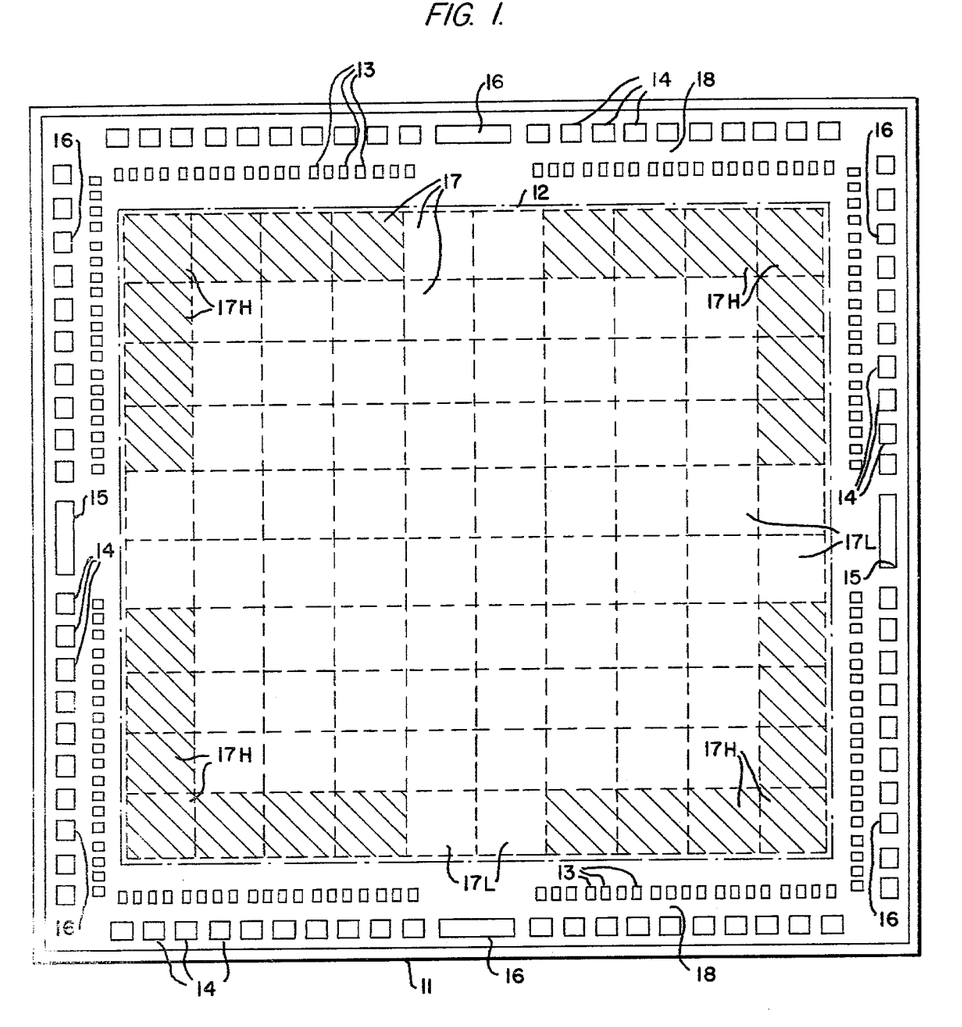
FIG. 1 is a plan view of a large scale semiconductor integrated circuit device according to the present invention.

The present invention is described in detail in reference to the drawings. FIG. 1 shows a silicon semiconductor substrate 11, the circuit area 12, (outlined by the broken line), large trnasistors for output 13, input/output terminal pads 14, power supply ($V_{EE}$) terminal pads 15 and ground ($V_{CC}$) terminal pads 16 arranged on a large scale semiconductor integrated circuit device (called an LSI chip hereinafter) of the present invention. The circuit area 12 is divided into 100 unit circuit areas 17 (each referred to as a macro hereinafter) aligned along respective row and column directions, as indicated by the dashed lines. The 28 macros 17H (shown with oblique lines) arranged at the positions near the four corners in the outermost rows and columns are the high power macros to be connected to an external circuit for output from the device, and the remaining 72 macros 17L are the low power macros which are terminated within the LSI chip. The detailed configuration of these macros is described further below.

Along the outside of the circuit area 12, 38 large output transistors per corner 13 are arranged in lines extending from each corner of said LSI chip along each side of the macro array. Outside the large output transistors 13, 20 terminal pads 16 per corner are arranged also extending from each corner of the LSI chip. Large pads 15, 16 are arranged near the center of each line of 21 terminal pads on each side of the circuit area 12 to form the power supply terminal pad 15 or the ground terminal pad 16. The power supply terminal pads 15 and the ground terminal pads 16 are symetrically arranged as shown. Moreover, the third terminal pad from each corner along the terminal pad columns containing the power supply terminal pad 14 are also employed as ground terminal pads 16. The remaining 76 electrode pads are designated as the I/O pads 14. As will be described later, these macros 17, large transistors 13, power supply terminal pads 15, ground terminal pads 16, and I/O pads 14 are connected as required by means of a double layer of metallic wiring, so that the LSI chip can comprise as much as 400 gate circuits.

In addition, the wiring channels 18 are provided between the large transistors 13 and the terminal pads 14, 15 and 16 to allow for interconnection between the macros, for connecting the macros to the terminal pads and for connection between the large transistors. In this array, the high power macros 17H are not located immediately adjacent the power supply terminal pads 15 and the ground terminal pads 16. Rather, the high power macros 17H and the corresponding large transistors 13 and the input/output terminal pads 14 are arranged as closely as possible. Moreover, the number of outputs of the high power macros 17H corresponds to the number of large transistors 13 and input/output terminal pads 14, and particularly the number of high power macros 17H is defined by the number of input/output terminal pads 14.

In another embodiment of the present invention, when the positions of the power supply terminal pads and of the ground terminal pads are changed, a high power macro may be correspondingly shifted to a different location other than the four corners along the outside of the array of macros. In addition, it is also possible to alternately arrange the high power macros and the low power macros along the outside of the macro array.

Figure 2:
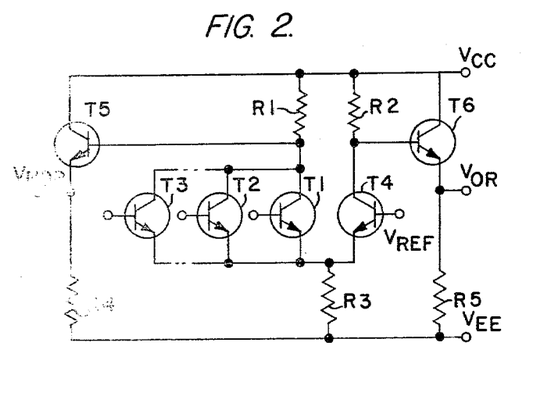
FIGS. 2 to 4 are schematic diagrams showing basic configurations of electronic circuits for the large scale semiconductor integrated circuit device of the present invention.
Figure 3:
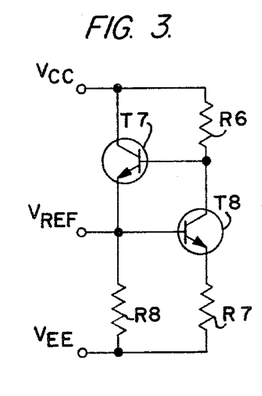
Figure 4:
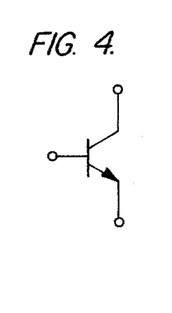

FIG. 2 to FIG. 4 show diagrams for basic circuits of the macros. FIG. 2 shows an emitter coupled logic circuit (current switch emitter-follower) which allows a maximum of three inputs, and which forms the basic logic circuit in the LSI chip of the present invention. The emitter coupled logic (ECL) comprises six NPN type transistors $T_1$ to $T_6$ and five resistors $R_1$ to $R_5$. Here, the transistors $T_1$ to $T_3$ are input transistors for the ECL and the transistor $T_4$ is a reference transistor. The emitters of the input transistors $T_1$ to $T_3$ and $T_4$ are connected in common. Transistors $T_1$ to $T_3$ form a current switch. The transistor $T_5$ is an output transistor which is connected to the collector of the input transistors to form an emitter-follower output circuit together with the resistor $R_4$, making possible the extraction of a NOR output. The transistor $T_6$ is also an output transistor which is connected to the collector of the reference transistor $T_4$ and forms an emitter-follower output circuit together with the resistor $R_5$, making possible the extraction of an OR output. The resistor $R_1$ is a load resistor for the input transistors, while the resistor $R_2$ is a load resistor for the reference transistor $T_4$. Moreover, the resistor $R_3$ is a current bias resistor for the current switch. As embodiments of the present invention, up to four or more of these emitter coupled logic circuits may be arranged in one macro.

FIG. 3 shows a bias driver circuit for the emitter coupled logic circuit. This bias driver circuit comprises two NPN type transistors $T_7$, $T_8$ and three resistors $R_6$ to $R_8$. The output terminal $V_{REF}$ of the bias driver circuit is connected to the base of the reference transistor $T_4$ of the emitter coupled logic. One of these bias driver circuits is provided in each macro comprising such ECL circuits, and each biased driver generally drives all the ECL circuits in common.

FIG. 4 shows a large transistor forming an emitter follower circuit for output for external connection, which is generally arranged as described above between the macros and the input/output terminal pads of the LSI chip. The transistors and resistors for the above-mentioned circuits are all arranged within each respective macro. Although not illustrated in the circuit diagram, the termination resistors $R_4$ and $R_5$ may have alternate resistor patterns to achieve the desired options in resistance values. These alternate configurations allow selection as desired to connect two resistors in parallel or to use only a single individual resistor. Also a current bias resistor $R_3$ may be given two or three resistor patterns also to allow greater flexibility for connecting those resistors as desired in parallel or individually, so that the emitter voltage and the current of the transistors forming a current switch can be adjusted.

Figure 5:
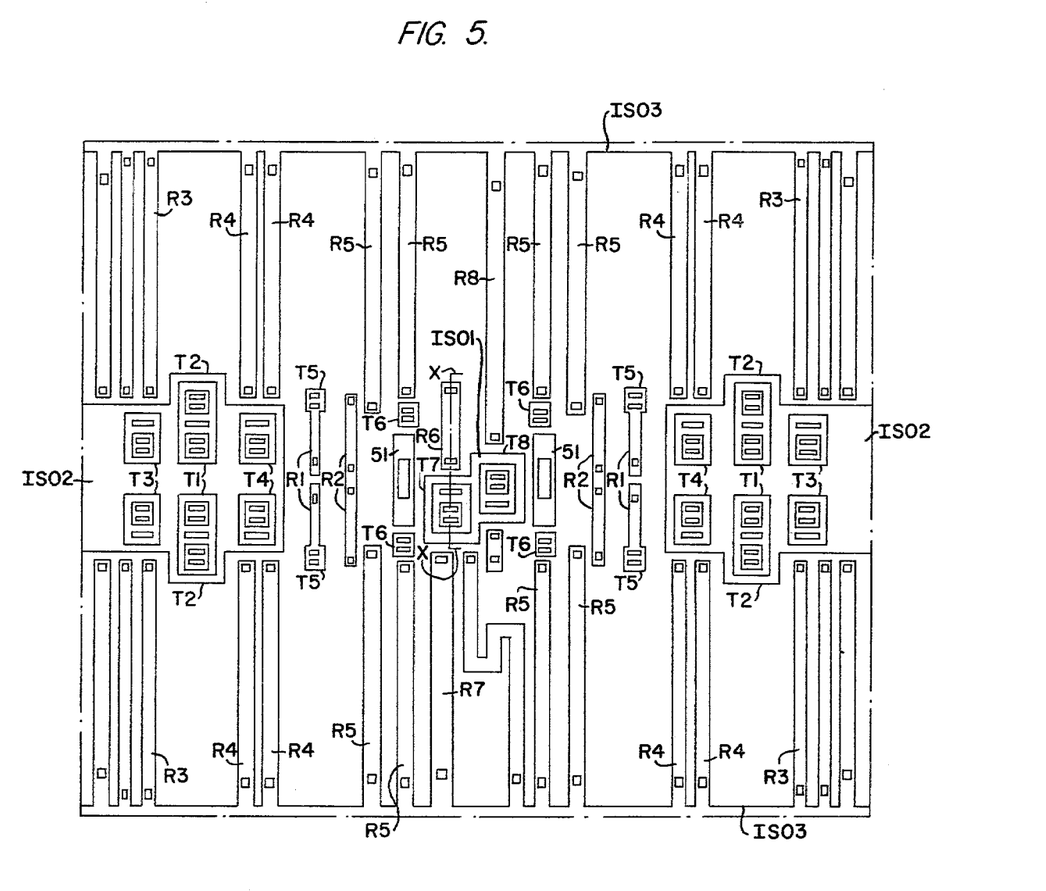
FIG. 5 is a plan view indicating the diffusion pattern for low power macros in a large scale semiconductor integrated circuit device according to the present invention.
Figure 6:
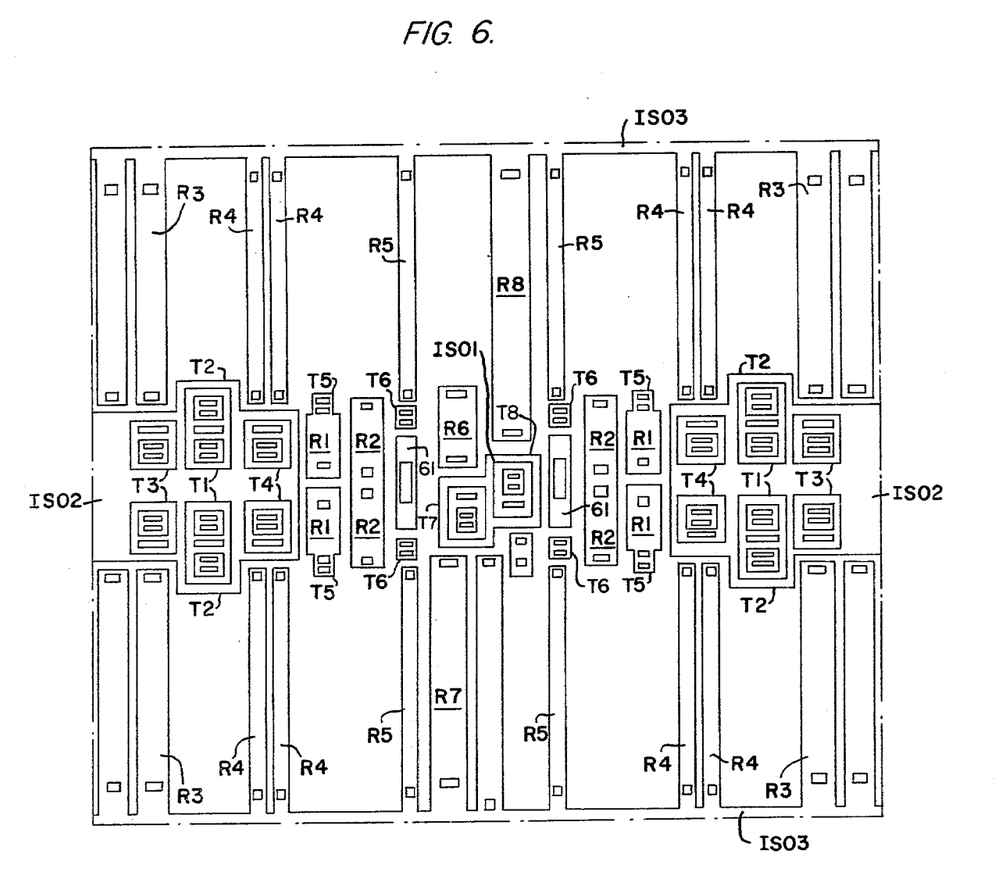
FIG. 6 is a plan view indicating the diffusion pattern for high power macros in a large scale semiconductor integrated circuit device according to the present invention.

FIG. 5 and FIG. 6 show the diffusion patterns for one macro comprising the four ECL circuits, the bias driver circuit, and spare termination resistors and current bias alternate resistors. FIG. 5 shows the diffusion pattern and the associated electrode window patterns of a low power macro (17L in FIG. 1), that is for a circuit terminated within the LSI chip. The reference numerals of the transistor resistor patterns are the same as in the circuit diagrams of FIG. 2 to FIG. 4.

FIG. 5 shows the transistors $T_7$ and $T_8$ of the bias driver circuit, resistors $R_6$ to $R_8$ arranged in the center area of the macro, and four pairs of transistors $T_1$ to $T_6$ and resistors $R_1$ to $R_5$ respectively provided in almost symmetrical pattern at both sides of the bias driver circuit to form two emitter coupled logics. The resistors are formed from a P type region within the N type substrate having a rectangular band shaped pattern or they are formed with a fold-back pattern as shown for $R_7$ when a high resistance value is necessary. Electrode windows are indicated by the rectangular marks (□) within the diffusion pattern. In the figure, the emitter diffusion areas generally coincide with the emitter electrode windows.

The transistors $T_7$ and $T_8$ are mutually insulated from each other and from the N type region in which the resistors are formed by the P type isolation region $I_{SO\ 1}$. The transistors $T_1$ to $T_4$ are also insulated from each other and from the N type region in which the resistors are formed by the P type isolation region $I_{SO\ 2}$. Here, transistors $T_1$ and $T_2$ have a common collector configuration, while transistors $T_3$ and $T_4$ are mutually independent. As for transistor $T_5$, the collector is directly grounded and the base is of the P type, while the load resistor $R_1$ connected to the base is also P type. Therefore, the base region and the load resistor $R_1$ are formed in the N type region in which resistors are formed, with the same continuous diffusion pattern.

The transistor $T_6$ is also directly grounded at its collector as is the case of said transistor $T_5$, the collector thus being formed within the N type region wherein the resistors are formed. For this reason, an N+ type region 51 is formed in the N type region in order to apply the ground voltage to the N type region comprising the collectors of transistors $T_5$ and $T_6$. The resistor $R_2$ comprises a common and continuous resistor pattern in the two adjacent ECL circuit elements symmetrically disposed above and below each other. A pair of electrode windows are symmetrically and separately arranged near the center of the $R_2$ resistor pattern. Therefore, the two electrode windows can be connected in common, or only one single electrode window can be selected for connection.

Dual resistor patterns are provided for each of the termination resistors $R_4$ and $R_5$, for parallel connection or for individual use as required. Three resistor patterns are provided for the current bias resistor $R_3$ of the current switch, so that any combination of these patterns can be connected. Thus, the emitter voltage and the current of the transistors forming the current switch can be controlled.

Since the resistors $R_3$, $R_4$, $R_5$, $R_7$ and $R_8$ are connected in common to the power supply, they are connected to the P type isolation region $I_{SO\,3}$. This isolation region $I_{SO\,3}$, as will be explained later, is maintained at the same potential as the isolation regions $I_{SO\,1}$ and $I_{SO\,2}$ by means of the P type semiconductor substrate. Although not illustrated, the isolation regions $I_{SO\,2}$ are symmetrically extended into the laterally adjacent macros, that is in the left and right directions in FIG. 5, thus accommodating transistors $T_1$ to $T_4$ in these adjacent macros. In the same way, although not illustrated, the isolation region $I_{SO\,3}$ is extended both to the laterally adjacent macros and also to the ajacent macros above and below the macro of FIG. 5.

As a modification of the above embodiment, it is also possible not to insulate transistor $T_7$ from the resistors by means of the isolation region $I_{SO\,1}$, but as in the case of the transistors $T_5$ and $T_6$, the collector region may be directly grounded. Thus the $N^+$ type region 51 would be used as the collector terminal for transistor $T_7$ as well.

FIG. 6 shows the diffusion pattern and the associated electrode window pattern of a high power macro (17H in FIG. 1) for connection to a circuit external of the LSI chip where the identification of the transistor and resistor patterns again correspond to that of the circuit elements shown in FIG. 2 to FIG. 4. As is clear from FIG. 6, the transistors $T_7$, $T_8$ and resistors $R_6$ to $R_8$ which form the bias driver circuit are arranged in the center region of the macro. Four pairs of the transistors $T_1$ to $T_6$ and resistors $R_1$ to $R_5$ are arranged symmetrically on both sides of the bias driver circuit elements, thus forming two ECL circuits.

The resistors are again formed with the long rectangular band-shaped patterns and comprise P type regions. Electrode windows are located near both ends of these resistors, as shown by the rectangular symbols. Moreover, the width of these rectangular resistor patterns in the high power macros may be wider than in the low power macros, and the associated resistance values are therefore lower, so that a larger current can be applied to the resistors. The transistors $T_7$ and $T_8$ are again insulated from each other and from the N type region in which the resistors are formed by means of the P type isolation region $I_{SO\,1}$. The transistors $T_1$ to $T_4$ are mutually insulated from each other and from the N type region in which the resistors are formed, by means of the P type isolation region $I_{SO\,2}$. Here, transistors $T_1$ and $T_2$ have a common collector configuration while transistors $T_3$ and $T_4$ are mutually independent. The transistor $T_5$ is formed in the N type region wherein the resistors are formed, with the diffusion pattern wherein the base region and the load resistor $R_1$ are in common, since the collector is directly grounded and the base and also the load resistor $R_1$ to be connected to the base are P type. The transistors $T_6$ is also directly grounded at its collector as in the case of said transistor $T_5$, the base and emitter are also formed in the N type region where the resistors are formed. The $N^+$ type regions 61 are formed in the N type region in order to lead out the collector of transistors $T_5$ and $T_6$ and to apply the ground voltage to the N type region where the resistors are formed.

It is a characteristic of this configuration that the transistor in the high power macros are made larger than in the low power macro, and particularly that the emitter region area is also made wider, so that a larger current can be applied. Thus, the transistor with such a configuration can handle considerably higher power. The resistor $R_2$ has a continuous resistor pattern common to the two adjacent ECL circuit elements arranged above and below each other, as shown in FIG. 6. The resistor patterns are again provided with a mutually separated pair of electrode windows near the center area. Thereby, these two electrode windows may be connected in common, or any of the electrode windows may be selected. In addition, as for the termination resistor $R_4$, a pair of parallel resistor patterns are provided, and these may be connected in parallel or a single desired one may be selected.

For the current bias resistor $R_3$ of the current switch, two wide resistor patterns are provided as shown, and these two resistor patterns may be used in parallel or a single one may be selected, as required. Thereby the emitter voltage and the emitter current of the transistors forming a current switch can be set. Since the resistors $R_3$, $R_4$, $R_5$, $R_7$ and $R_8$ are connected in common to the power supply, the resistor patterns are connected to the P type isolation region $I_{SO\,3}$, and thus one end of each resistor is kept at the power supply voltage. The isolation region $I_{SO\,3}$ is, as will be described, kept at the same voltage as that of said isolation regions $I_{SO\,1}$, $I_{SO\,2}$ by means of the P type semiconductor substrate.

Although not illustrated, the isolation region $I_{SO\,2}$ extends symmetrically to the laterally adjacent macros, thus accommodating transistors $T_1$ to $T_4$ in the adjacent macros. The isolation region $I_{SO\,3}$, as described in connection with FIG. 5, also extends into the laterally adjacent macros and as well is formed in common with corresponding circuit elements in the vertically adjacent macros.

As another modification of the above embodiment, it is also posible that the transistor $T_7$ be not insulated from resistors by means of the isolation region $I_{SO\,1}$, in which case the collector would be directly grounded in the vicinity of the base of $T_7$, as in the case of transistors $T_5$ and $T_6$. Thus, the $N^+$ type region 61 could be used as the collector lead-out terminal.

In the above macro configuration, the resistors $R_3$ and $R_7$ may have the values shown in the Table 1, as an example of standard values respectively in the low and high power macros.

TABLE 1

|  | Low power macro (ohm) | High power macro (ohm) |
|---|---|---|
| $R_3$ | 3600 | 950 |
| $R_7$ | 3090 | 1650 |

Wiring may be arranged along the row direction for connecting between macros, or between macros and I/O pads, and may comprise a first wiring layer in the region in which resistors $R_3$, $R_4$, $R_5$, $R_7$ and $R_8$ are formed.

The wiring arranged along the column direction for connecting between macros, or between macros and I/O pads, may be formed mainly by a second wiring layer in the region of the macros between the ground wiring and power supply wiring. Thus, the emitter follower output from the high power macro shown in FIG. 6, for example, may be connected to the peripheral area of the LSI by the first wiring layer for input to a large scale emitter follower transistor and hence to an output terminal pad.

Figure 7:
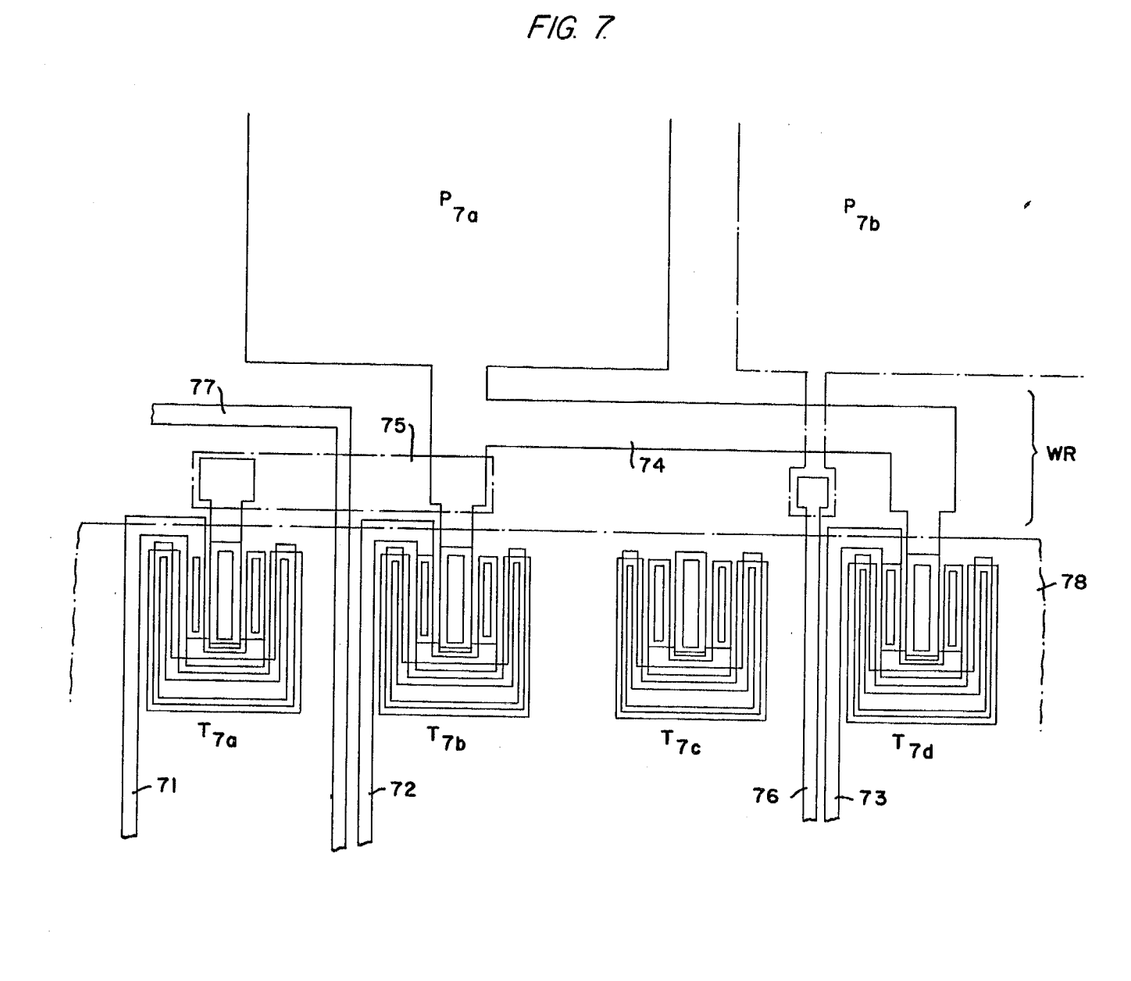
FIG. 7 is a plan view showing wiring from the macros connected to the output terminal pad via large transistors for output from the large scale semiconductor integrated circuit device of the present invention.

FIG. 7 shows a practical example of the connection between such a large scale emitter follower transistor and an output terminal pad. In the embodiment shown in FIG. 7, the output of the emitter follower circuit, extending from the collectors (not shown) of the transistors $T_1$ to $T_3$ or transistor $T_4$ forming the current switch in the high power macro, is connected to the bases of the large scale emitter follower transistors $T_{7a}$, $T_{7b}$ and $T_{7d}$, respectively via the wirings 71, 72 and 73. The emitters of the transistors $T_{7a}$, $T_{7b}$, $T_{7d}$ are mutually connected as desired in the wiring channel WR provided between the transistors and the terminal pads by means of the first wiring layer 74 and the second wiring layer 75 (shown with dotted lines) formed in the wiring channel WR. This first wiring layer is extended to form the terminal pad $P_{7a}$.

A wiring 76 led out from the macros connects to the second wiring layer in the wiring channel, where it crosses over with the first wiring layer, the first layer connecting the emitters of the large scale emitter follower transistors. The second wiring layer is extended to form the terminal pad $P_{7b}$. The wiring channel WR also contains the wiring for mutual connection between macros, in addition to the wirings for mutual connection of the emitters of the large scale emitter follower transistors and the wiring for the terminal pads. The wiring for the collectors of the transistors $T_{7a}$ to $T_{7d}$ and ground 78 are connected via the windows provided on the collector regions of the transistors. Termination resistors (not shown) may be connected to the emitters of the large transistors for output and the logical outputs from the emitter follower circuits shown in FIG. 7. These may be inserted and connected in an area near a terminated part of an output line extending from the large transistor in an external circuit (not illustrated) of the LSI chip.

In the above explanation, a basic ECL circuit is formed within each of many macros. However, the configuration of the logic circuit in the macros of the LSI chip of the present invention is not limited only to the basic circuit example above. In order to satisfy any required logic functions, multiple input gate, wired OR or flip-flop etc., the logic circuits to be formed in the different macros are determined as required. Moreover, the wirings of the 100 macros in the LSI chip is also determined to satisfy the logic functions required for each LSI chip. In addition, from the view point of the master-slice technique, there is no limitation that an LSI chip must be formed by making full use of all 100 macros.

Explained next is a configuration for compensation (or tracking) voltage variations due to the position of a macro in the semiconductor substrate, as supplied by the ground and power supply wiring on the LSI chip, according to the present invention.

Figure 8:
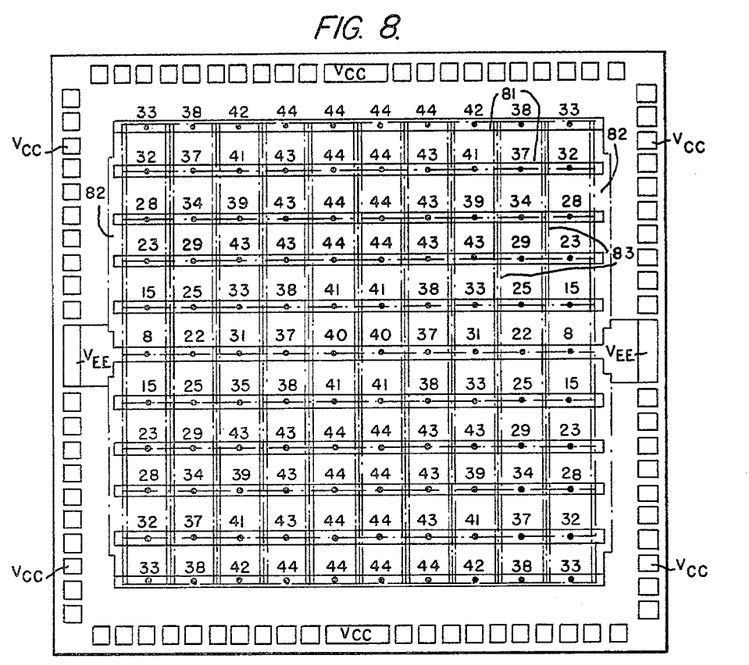
FIGS. 8 and 9 are the plan views showing the power supply wiring pattern and its distributed voltage variation, and the ground wiring pattern and its distributed voltage variation, respectively, in a large scale semiconductor integrated circuit device of the present invention.

FIG. 8 shows the macros arranged on the LSI chip and the power supply wiring, according to the present invention. The positions of the macros are indicated by the repective broken lines. The power supply wiring 81 comprises a first wiring layer provided at the boundary between adjacent macros and extending continuously in the row direction. The connection of this first wiring layer to the power supply is provided by trunk lines 82 arranged along the outside of the macro array, that is, at the outermost areas in the row direction. The power supply wiring 81 comprises 11 lines total oriented in the row direction. Said 11 power supply wirings 81 are connected to the trunk power supply wiring 82. This trunk wiring is formed by a second wiring layer provided between the macros and the terminal pads, at both terminated ends of the wirings 81. The central portion of the trunk power supply wiring 82 is connected to the terminal pad 15. Moreover, the 11 power supply wirings may be mutually connected by the local power supply wiring 83 (indicated by the broken lines) which are formed with the second wiring layer to extend in the column direction.

In such a configuration for the power supply wiring, an example of the variation in the voltage as distributed from the power supply terminal pad is shown by the data indicated in FIG. 8. Each value indicates the increase in voltage in units of mV at each part of the power supply wiring, as viewed from the power supply terminal pad which is held at a negative potential. As will be obvious from the above explanation, the areas near the power supply terminal pads show little change in voltage, while the areas further from the power supply terminal pad show large changes in voltage.

Figure 9:
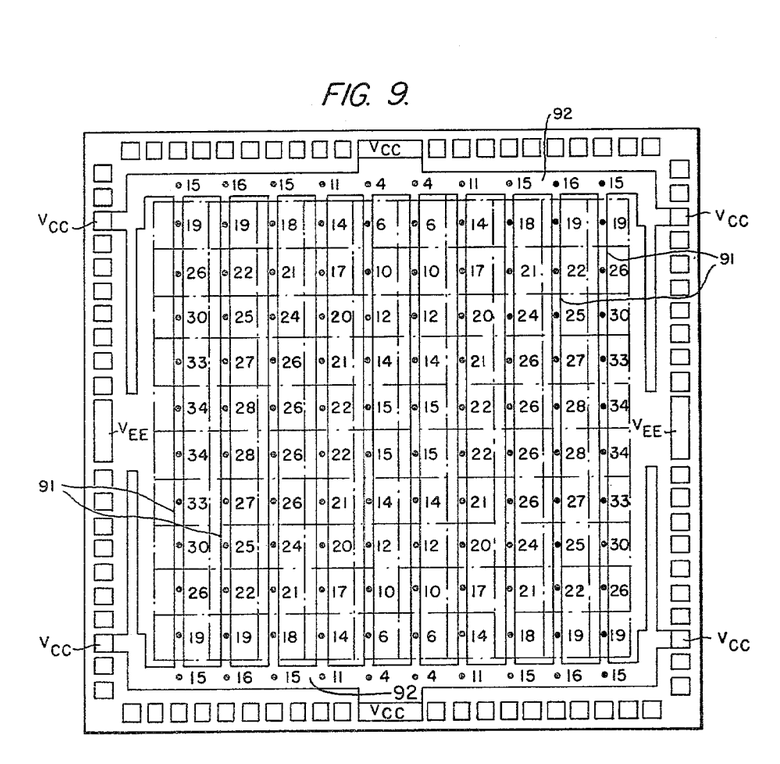

FIG. 9 shows the macros arranged on the LSI chip of the present invention and the ground wiring pattern which distributes ground potential to these macros. The positions of the macros are outlined by broken lines. Each ground wiring 91 of the second wiring layer is connected to the substrate in the center of each macro at electrode windows 51 and 61 as described above and continuously extended into the 10 pairs of macros provided in the column direction. Therefore, a total of 10 ground wirings 91 are provided, and these are connected at both their ends to the trunk ground wiring 92 which is provided between the macros and the terminal pads. Said trunk ground wiring 92 is moreover extended and connected to the local terminal pads 16. This trunk ground wiring 92 can also be extended along the column direction as shown to supply ground potential to the large scale transistors (13 in FIG. 1).

In such a ground wiring configuration, an example of the drop in voltage as distributed from the ground terminal pad is shown by the values indicated in FIG. 9. Each value indicates a voltage drop at each part of the ground wiring relative to the ground terminal pad, thus the voltage drops where the ground wirings 91 branch from the trunk wiring layer 92 and near the center of each macros, in units of mV. As will be clear from the above description, the area near the ground terminal pad shows a small voltage drop, while the area far from the ground terminal pad shows a large voltage drop.

The difference in distributed voltage in the power supply and ground wiring systems results from the resistance of the metallic wiring layers forming these wiring systems, and current is supplied to each macro after flowing through said metallic wiring layers. This difference in distributed voltage in the power supply and ground wiring interferes with normal operation of the circuits in the macros. For example, an attempt to operate all 400 ECL circuits which may be formed in the 100 macros arranged in the LSI chip by extracting even only one output from the two outputs of each logic circuit can cause a fluctuation of about 30 mV. This voltage variation may be observed, for example, in the reference switching voltage $V_{REF}$ or in the low level output logic voltage $V_{OL}$ (that is either one $V_{OR}$ or $V_{NOR}$) of the respective macro.

For compensating such differences in $V_{REF}$ and $V_{OL}$, the basic configuration of the present invention allows each value of resistors $R_1, R_2, \ldots R_8$ which form the ECL circuits provided in each macro to be changed in accordance with the location where the relevant macro is arranged. Thus, formation of the metallic layers is facilitated, without requiring complicated modification of the width, etc., of the metallic layers forming the power supply and ground wiring systems. It would be very complicated individually to design the resistors $R_1, R_2, \ldots, R_8$ for each of the 100 macros when changing each value of the resistors $R_1, R_2, \ldots, R_8$ in each macro in accordance with macro location. Moreover, if fluctuations in the manufacturing process are considered, then it is clear that sufficient compensation cannot be so provided.

Figure 10:
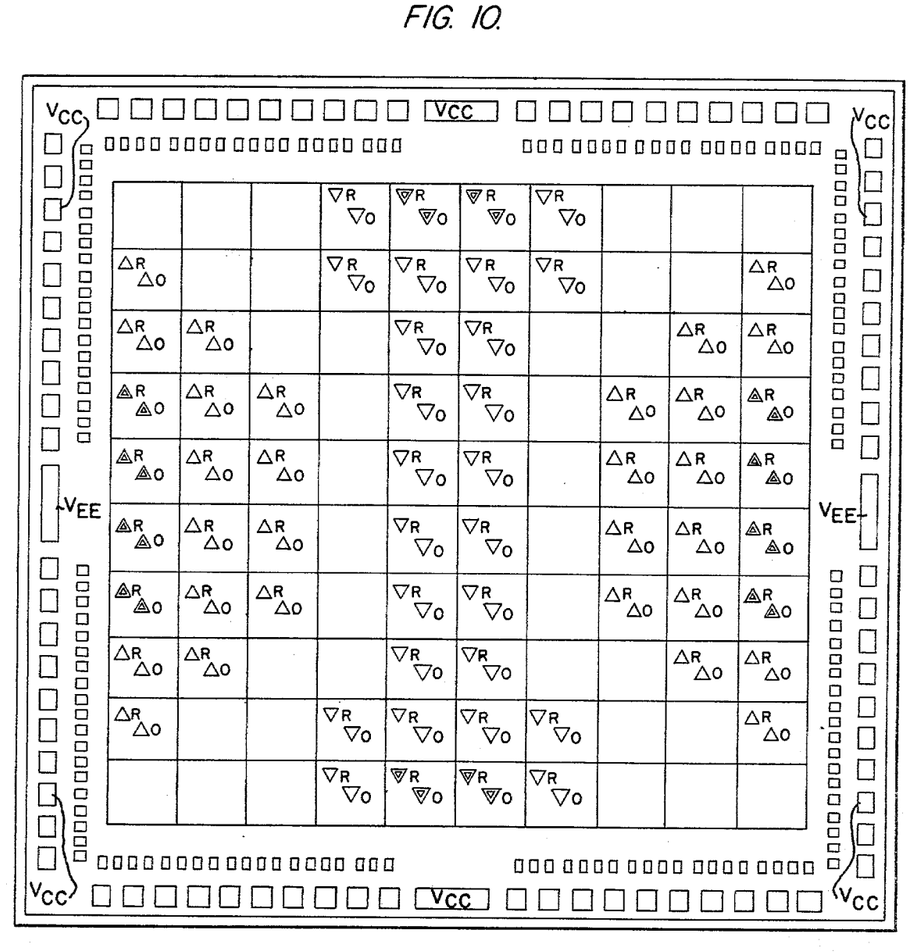
FIG. 10 is a plan view showing the compensation for variation in voltage of the power supply and the ground wiring pattern for each macro in a large scale semiconductor integrated circuit device of the present invention.

Thus, in the LSI chip of the present invention, for each of $V_{REF}$ and $V_{OL}$, or for their corresponding variations $\Delta V_{REF}$, $\Delta V_{OL}$, one may choose, for example, two incremental levels for correction in each of the plus and negative directions. Therefore, the optional values of resistors $R_1, R_2, \ldots, R_8$ in each macro may be designed so that five stages of voltage values are provided for each macro in the LSI chip. For instance, FIG. 10 shows typical compensations that may thusly be provided to $V_{REF}$ and $V_{OR}$ for providing uniformity of these voltage values from the 100 macros provided on the LSI chip.

The symbols in this figure have the following meanings: $\Delta R$ is the compensation of $V_{REF}$ for the corresponding macro;

$\Delta O$ is the compensation of $V_{OL}$ for the corresponding macro; and $\Delta$ means that one step of compensation is made from the reference voltage to a higher voltage;

⚠ means that two steps of compensation is made from the reference voltage to a higher voltage;

$\nabla$ means that one step of compensation is made from the reference voltage to a lower voltage; and ▽▽ means that two steps of compensation is made from the reference voltage to a lower voltage.

As is clear from this figure, the macros which are near to the power supply terminal pads and the ground terminal pads require the largest amount of compensation. On the other hand, the macros located along the diagonal lines of the macro array require little compensation. The macros near the center of the array usually require no compensation since they are equally distant from the power supply and ground terminal pads. However, in the case of the present invention, some compensation is required because the high power macros are not arranged in the peripheal part of the array viewed from both electrode pads.

In the LSI chip of the present invention, the reference voltages of $V_{REF}$ and $V_{OL}$ are set, for example, as indicated below.

$V_{REF} = -1.3$ V $V_{OL} = -1.7$ V

Moreover, the resistance values to provide this compensation are set as indicated in Table 2 in correspondence with the voltage variations shown in FIG. 8 and FIG. 9, and also considering the average number of gates used. As is clear, each of $V_{REF}$ and $V_{OL}$ is compensated in each of the high power macro and low power macro, and it is natural that the resistance values are different.

TABLE 2

| Level to be compensated | Compensation amount | Resistance to be compensated | Resistance value Low power Macro | Resistance value High power macro |
|---|---|---|---|---|
| $V_{REF}$ | ⚠⚠ | $R_7$ | 3150 (Ω) | 1680 (Ω) |
|  | $\Delta$ |  | 3120 | 1670 |
|  | — |  | 3090 | 1650 |
|  | $\nabla$ |  | 3050 | 1630 |
|  | ▽▽ |  | 3020 | 1610 |
| $V_{OL}$ | ⚠⚠ | $R_3$ | 3640 (Ω) | 970 (Ω) |
|  | $\Delta$ |  | 3620 | 960 |
|  | — |  | 3600 | 950 |
|  | $\nabla$ |  | 3580 | 940 |
|  | ▽▽ |  | 3560 | 930 |

In the compensation means shown in Table 2, a resistor $R_7$ is compensated for adjusting the value of $V_{REF}$, but it would also be possible to compensate the resistor $R_6$ and/or both resistors $R_6$ and $R_7$ for this same purpose. In the same way, for adjusting the value of $V_{OL}$, not only the resistor $R_3$ but also resistors $R_1$, $R_2$ and $R_3$ could be compensated.

Compensation for voltage variation due to heat generation in the LSI chip can be realized by increasing the wiring resistance, as by the prior art compensation methods, but this is not effective for the present LSI chip since increasing the resistance in the wiring deteriorates a high level output.

Figure 11:
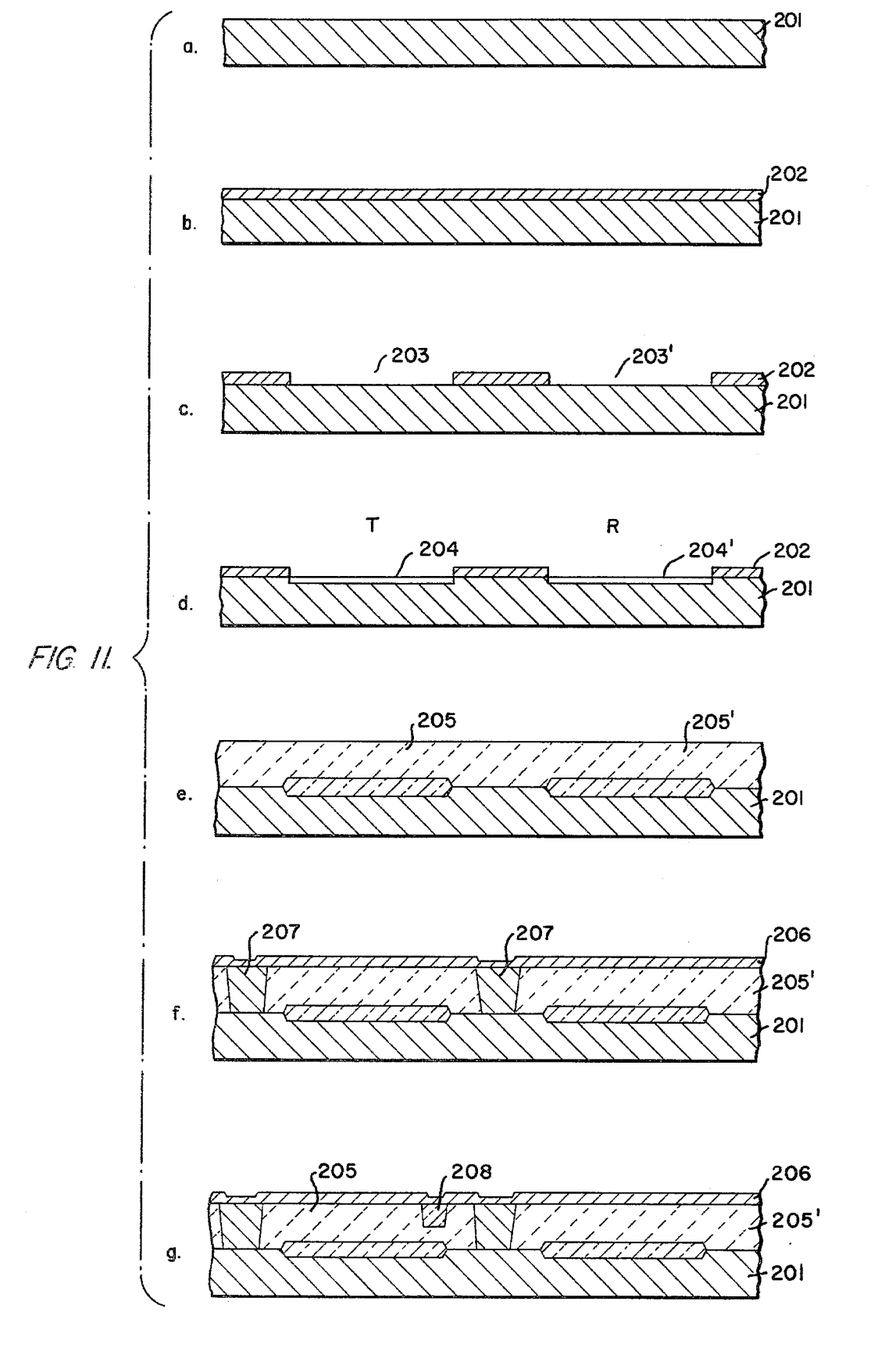

The LSI chip of the present invention may be produced by the following manufacturing process. The bipolar integrated circuit configuration has a generally planar configuration. Such a manufacturing process is explained by referring to FIGS. 11a to 11n. The process shown in these figures produces a device with a configuration of one transistor and one resistor, as shown, for example, in the cross section X-X' in FIG. 5.

A silicon semiconductor substrate 201 having a planar surface and a diameter, for example, of 76.2 mm is prepared as shown in FIG. 11a. The silicon semiconductor substrate has a P type conductivity with a specific resistance of 5 to 20 ohm-cm, for example.

Then, as shown in FIG. 11b an insulation film 202 is formed covering the surface of the semiconductor substrate 201 in thickness, for example, of 4000 Å. This insulation film 202 may comprise silicon dioxide ($SiO_2$). This silicon dioxide film can be formed, for example, by direct oxidation of the surface of the semiconductor substrate 201 for 30 minutes at a temperature of 1100° C. in a wet oxidizing atmosphere. Then, as shown in FIG. 11c apertures or windows 203, 203' for injecting impurities are formed on the insulation film. As a means for providing an aperture to said insulation film, a well known photo-etching method may be applied. Moreover, it is also possible to utilize plasma etching with a halogen gas of $CF_4$.

It is a characteristic of the present invention that the windows are formed not only in the area T where a transistor is to be formed, but also in the area R where a resistor is to be formed. Subsequently, as shown in FIG. 11d a proper donor type impurity is selectively injected into the exposed surface of the semiconductor substrate 201 to form the N+ type regions 204 and 204'. Antimony (Sb), phosphorous (P) or arsenic (As) are well known donor type impurities that can be used, and these may be introduced by the well known diffusion method, thus forming the N+ type regions 204, 204' with a depth of 3 to 10 microns. As the diffusion method, a gas phase diffusion or a solid-solid phase diffusion method etc., can be used as desired.

Then, the insulation film 202 is removed and, as shown in FIG. 11e and N type epitaxial layer 205, 205' having a low impurity concentration is formed on the surface of the exposed semiconductor substrate. The epitaxial growth can be realized by a well known method, for example, a gas phase reaction of the hydride of the donor impurity with silicon tetrachloride (SiCl$_4$). The N type epitaxial layer 205, 205' is formed with a thickness of 2 to 3 microns. At this time, the donor impurities diffuse out from the N+ type regions 204, 204' and are partially diffused into the substrate 201 and the epitaxial layer 205, 205', to form N+ type buried layers. Then, as shown in FIG. 11f an insulating film 206 is formed covering the surface of the N type epitaxial layer with a thickness of 4000 Å, for example, followed by forming a window in the insulating film 206 at desired positions through such a window. The P type isolation region 207 is formed by selectively diffusing an adequate acceptor impurity, for example, boron (B) is well known. The gas phase diffusion method, or the solid-solid phase diffusion method mentioned above can also be used.

Then, as shown in FIG. 11g, a window is formed at a desired position of the insulating film 206 covering the N type epitaxial layer 205, for example, at the position on one land 205 of the N type epitaxial layer and then a donor impurity is selectively diffused, to form the N+ type collector contact area 208 with a thickness of 1.5 to 2.5 microns. Subsequently, as shown in FIG. 11h a window is again formed in the desired position of the insulating film 206 covering the surface of the one land 205 of the N type epitaxial layer and the acceptor impurity is selectively injected, thus forming the P type base region 209 with a thickness of, for example, 0.3 to 1 micron.

In the next step, as shown in FIG. 11i windows are respectively formed over the base region 209 of the insulating film 206 covering the surface of the one land 205 of the N type epitaxial layer and over on the desired position of the insulation film 206 covering the surface of the other land 205' of N type epitaxial layer, and then the acceptor impurity is selectively injected again, thus forming the P type base contact region 210 in said base region 209, and the P type resistance region 211, respectively. These P type regions 210 and 211 are formed with a thickness, for example, of 0.2 to 0.8 microns. Then, as shown in FIG. 11j windows are formed again over the base region 209 in the insulating film 206 covering the surface of the one land 205 of the N type epitaxial layer, and over the N type collector contact region 208 adjacent to said base region 209, and then a donor impurity is injected selectively again to form the N+ type emitter region 212 in said base region 209 and the N+ type region 213 in said collector contact region 208. These N+ type regions 212 and 213 are formed with a thickness of 0.2 to 0.8 microns, for example. For the injection of impurities into the semiconductor substrate or epitaxial layer, a well known ion injection method may be applied instead of the above-mentioned diffusion method. When the depth for impurity injection, namely the depth of the specified conductivity type region to be formed, is shallow, then an ion injection method is particularly effective.

When an impurity is injected into a semiconductor substrate or an epitaxial layer, many apertures or windows for impurity injection may be provided in an insulating film formed on the surface of the epitaxial layer. Because of this impurity injection, the surface of the insulating film can become very rough, with many jogs and dents. Such a rough surface of the insulation film makes difficult the precise formation of the metallic wiring layer formed subsequently in the injection process, and can cause a discontinuity in the metallic wiring layer. Thus, in the case of the present invention, in the process shown in said FIG. 11i, for example, the acceptor impurity may be deposited on the surface of the P type base region 209 through a window formed in the insulating film on the surface of the land 205 of N type epitaxial layer. Thereafter, the insulating film is removed by etching and then thermal processing is carried out in an oxidizing atmosphere. As a result, the base contact region 210 is formed in the P type base region 209 and the resistor region 211 is formed in the land 205' of the N type epitaxial layer. Simultaneously, an insulating film of silicon dioxide with uniform thickness is formed on the surface of the epitaxial layer. Therefore, only the windows for forming the emitter region and the collector contact region by ion injection remain, and thereby flatness of the insulating film is maintained.

Then, as shown in FIG. 11k the windows for providing the collector base and emitter electrodes, and the window for providing the resistor are formed in the insulation film 206 covering the epitaxial layer surface. Thereafter, a metallic film comprising, for example, aluminum (Al) is deposited in these windows and on the surface of the insulating film, and the metallic film is removed selectively in accordance with the desired wiring pattern, thus forming a first wiring layer 214. For deposition of aluminum, a vacuum evaporation method can be used, and for selective removal, a photo-etching or plasma etching method can be applied. The aluminum wiring layer is formed with a thickness of about 1 micron. Then as shown in FIG. 11l an insulation layer 215 comprising phosphosilicate glass (PSG) is coated over the first wiring layer 214 and the exposed surface of the insulating film 206. This phosphosilicate glass can be formed by a chemical reaction from a gas phase of monosilane (SiH$_4$) and phosphine (PH$_3$) to a thickness of about 1 to 2 microns.

Then, as shown in FIG. 11m an aperture or window is formed at the desired portion of the insulating film and then aluminum is coated again covering the insulating layer and windows, and then selectively removed to form the second wiring layer 216 on the insulating layer. For selective removal of the phosphosilicate glass layer, a photo-etching or plasma etching method may be used. Thereafter, as shown in FIG. 11n a surface protection layer 217 comprising for instance phosphosilicate glass is formed again covering the second wiring layer 216 and the exposed surface of the insulating layer 215. This surface protection layer is formed to a thickness of 2 to 3 microns on almost the entire part of the LSI chip, except for the input/output pad surfaces.

The LSI chip of the present invention can be formed by this manufacturing process described above.

Since a large scale semiconductor integrated circuit device of the present invention comprising low power macros for internal circuits and high power macros for output to external circuits, power consumption is minimized with high integration density. Thusly, the ability to drive external circuits to be connected to the large scale semiconductor integrated circuit device is drastically improved.

In addition, the large scale semiconductor integrated circuit device of the present invention is capable of compensating for variation of power supply voltage and ground potential within an LSI chip by allowing for incremental adjustment in the values of resistors formed in each of the macros, thus ensuring very stable operation.

We claim:

1. An LSI chip comprising:
   a semiconductor substrate having a planar surface;
   transistors and resistors formed with selected patterns in said surface;
   metallic layers formed on said substrate comprising systems for connecting said transistors and resistors and for distributing supply and ground potentials;
   macros comprising logic circuits, said macros being disposed in at least one array on said surface, and said logic circuits selectively comprising said transistors, resistors and metallic layers;
   input/output terminal pads provided on said surface near the periphery of said macro array(s), said input/output pads comprising terminal pads for said supply and ground potentials;
   said resistors forming said logic circuits being selected for compensating voltage variations along said metallic layers comprising said supply and ground potential distribution systems connected to said logic circuits.

2. The LSI chip of claim 1, said resistors forming said logic circuits being selectively determined in accordance with distances between the corresponding macro and said supply and ground potential terminal pads, respectively.

3. The LSI chip of claim 1, said macros comprising said logic circuits being selectively grouped in accordance with said distances and wherein corresponding resistors in the macros of each group have the same resistance values.

4. The LSI chip of claim 3, said grouping comprising five groups.

5. The LSI chip of claim 3,
   said chip comprising means for providing at least one reference voltage for said macros, and
   said resistors forming said logic circuits being selectively determined so that the level of at least one selected reference voltage in each of said groups is the same.

6. The LSI chip of claim 3, said logic circuits comprising emitter coupled logic circuits, said emitter coupled logic circuits having at least one low level output ($V_{OL}$) at least one low level output being the same in each of said groups of logic circuits, as a result of said resistors forming said logic circuits being selectively determined the same.

7. The chip of claim 5, said logic circuits comprising emitter coupled logic circuits, and said selected reference voltage comprising a reference switching voltage ($V_{REF}$).

8. The chips of claim 6 comprising at least two of said low level outputs ($V_{OR}$, $V_{NOR}$), at least one of said low level outputs being the same in each said logic circuit as a result of said selective determination of said resistors.

* * * * *